United States Patent [19]

Brown

[11] 4,271,528
[45] Jun. 2, 1981

[54] VARIABLE PULSE TUNING SYSTEM

[75] Inventor: Timothy W. Brown, Williamsville, N.Y.

[73] Assignee: GTE Products Corporation, Stamford, Conn.

[21] Appl. No.: 76,018

[22] Filed: Sep. 17, 1979

[51] Int. Cl.³ .............................................. H04B 1/16
[52] U.S. Cl. .................................. 455/179; 455/170; 455/195
[58] Field of Search ............... 455/153, 160, 166, 170, 455/175, 179, 183, 173, 169, 195; 358/191.1; 328/140; 307/233 R, 233 A

[56] References Cited

U.S. PATENT DOCUMENTS

| 3,671,870 | 6/1972 | Wellhausen | 455/169 |
| 3,803,495 | 4/1974 | Reynolds | 455/164 |
| 3,835,384 | 9/1974 | Liff | 455/173 |

Primary Examiner—Jin F. Ng
Attorney, Agent, or Firm—John A. Odozynski

[57] ABSTRACT

A variable pulse rate tuning circuit for use with a channel-selecting system incorporating a single, shaft-encoded tuning knob. The circuit includes a single pulse circuit that generates an individual channel-stepping pulse in response to individual channel-changing pulses derived from the shaft-encoded tuning knob. In addition a pulse adding circuit sensitive to the repetition rate of the channel-changing pulses generates additional stepping pulses during conditions under which a substantial number of channels are sought to be bypassed. The pulse adding circuit includes an integrator to control the operation of a gated RC oscillator.

15 Claims, 1 Drawing Figure

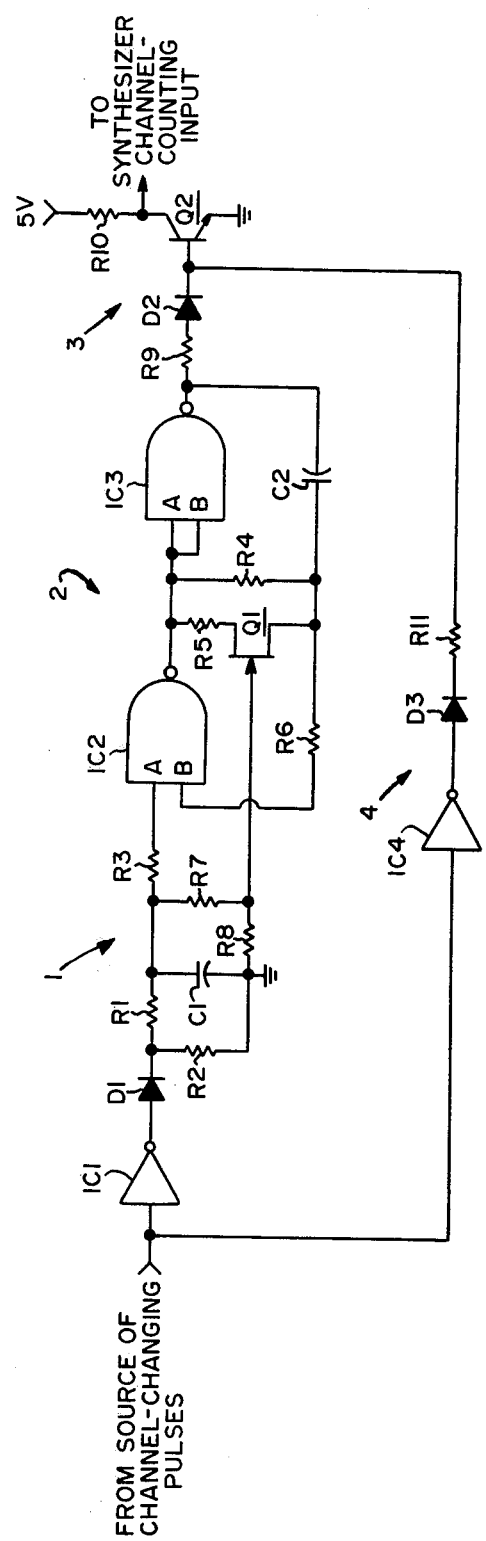

VARIABLE PULSE TUNING SYSTEM

TECHNICAL FIELD

This invention relates to tuning systems in general and more particularly to a circuit that effects rapid excursion through a large number of television channels via a shaft-encoded, single-knob channel selection mechanism.

BACKGROUND ART

As is well known, sufficient portions of the VHF and UHF spectra have been allocated to accommodate twelve VHF and seventy UHF channels for broadcasting and receiving television signals. Conventional television receivers almost invariably employed separate, usually mechanical, tuners with individual tuning knobs for the selection of either VHF or UHF channels. More recently, electronic tuners and frequency synthesis techniques have given rise to dramatic improvements in television channel selection systems. These improvements have generally been directed to reducing the size and cost while enhancing the performance and reliability of the receiver's channel-selection mechanism.

A particular approach allows both VHF and UHF channels to be selected by a single tuning knob. This approach is especially appropriate for use in conjunction with channel-selecting devices that include a digitally-controlled tuning synthesizer, such as the commercially available NITRON NC6405. For the purposes of understanding this invention, it is sufficient to consider the synthesizer's output frequency as being determined by the digital count present at its input. One-knob tuning can be effectuated by coupling the tuning knob to an electronically encoded shaft according to any of a number of known shaft-encoding techniques. As the viewer rotates the knob output pulses are developed and coupled to the synthesizer in a fashion that increments or decrements the count at its input, thereby providing access to all twelve VHF and all seventy UHF channels.

Despite the apparent advantages of such a channel-selection system, it might have been expected that in a situation where changing channels necessitates bypassing a large number of channels, as when changing from a low VHF to a high UHF channel, an inordinant amount of tuning knob rotation is required. The subject invention detects such a situation and effects more rapid channel changing in response.

DISCLOSURE OF THE INVENTION

The invention is an improvement in a tuning system that includes a channel-selecting device, such as a frequency synthesizer, that operates in response to channel-changing pulses such as may be derived from a single shaft-encoded VHF/UHF tuning knob on a television receiver. The improvement comprises a variable pulse rate tuning circuit coupled between the source of channel-changing pulses and the channel-selecting device. The circuit increase the rate at which channels are incremented or decremented during conditions under which a substantial number of channels are sought to be bypassed.

BRIEF DESCRIPTION OF THE DRAWING

The sole drawing is a schematic diagram of the subject variable pulse rate tuning system.

BEST MODE FOR CARRYING OUT THE INVENTION

For a better understanding of the present invention, together with other and further objects, advantages and capabilities thereof, reference is made to the following disclosure and appended claims in connection with the above described drawing.

Referring now to the drawing, a first inverting buffer IC1 has an input coupled to a source of channel-changing pulses (not shown). The channel-changing pulses are generated as the viewer rotates a single VHF/UHF tuning knob, the number and repetition rate of the pulses roughly corresponding to the number of channels sought to be bypassed. The output of IC1 is coupled to the input of an integrating means 1. The integrating means includes a diode, D1, having an anode coupled to the output of IC1 and a cathode connected to one end of a resistor R1; the other end of R1 is coupled through a capacitor, C1, to a reference potential, i.e., ground. The junction of R1 and D1 is also coupled through a resistor, R2, to ground. Although not shown in the drawing, it may be desirable to provide a variable resistor in parallel with or in place of R1 in order to adjust the integrator time-constant.

The output of the integrator, at the junction of R1 and C1, is coupled through a resistor R3 to the enabling input of an oscillator 2. The oscillator is of the RC type and is constructed from two dual-input NAND gates, IC3 and IC2, the A input of IC2 in effect representing the enabling input of the oscillator. The frequency of oscillation is determined by the values of R4 and C2, series-connected in that order from the commonly-connected A and B inputs of IC3 to its output. R4 and C2, together with R5 and Q1, an FET, comprise the oscillator's RC feedback network. The series-connected R5 and Q1 are coupled in parallel with R4 and vary, in manner described below, the oscillator's operating frequency. The junction of R4 and C2 is coupled through a resistor, R6, to the B input of IC2. The output of IC2 is connected to the input of IC3. The gate of Q1 is coupled through a resistor, R7, to the output of the integrator and also through a resistor, R8, to ground so that an attenuated portion of the integrator output appears at the gate of Q1.

The output of oscillator 2 is coupled through a series-connected resistor and diode, R9 and D2, to the input of a pulse combining circuit including an NPN transistor, Q2. Q2 has a base coupled to the cathode of D2, an emitter coupled to ground, and a collector coupled through a resistor, R10, to a 5-volt supply. Positive-going pulses at the base of Q2 appear inverted at its collector; the inverted pulses, hereinafter referred to as stepping pulses, are coupled to the channel-counting input of a frequency synthesizer such as the NITRON NC6405 (not shown). In general the synthesizer may be viewed as stepping up or down a channel in response to each of the stepping pulses.

The subject variable pulse rate tuning system also includes a single pulse circuit 4 coupled between the source of channel-changing pulses and the input of Q2. Circuit 4 includes a series-connected second inverting buffer, IC4, a diode, D3, and a resistor, R11. In a manner that will presently become apparent, the number of stepping pulses appearing at the input of the synthesizer will correspond to the sum of the pulses developed by the single pulse circuit 4 plus the additional pulses, developed under appropriate conditions, by the oscillator. For this reason the oscillator, in conjunction with integrator 1, may be deemed a pulse adding circuit. Operation is as follows.

Under normal conditions, that is, when only a limited number of channels are required to be bypassed in order to reach the desired channel, each channel-changing pulse will result in the generation of a single stepping pulse, the pulse developed by circuit 4. To be sure, the inverted channel-changing pulses will appear at the cathode of D1, but, assuming zero volts initially across C1, the (R1×C1) charging time constant will be too long for the integrator output to reach the logic ONE level (threshold level) of IC2 (approximately 2-volts), a prerequisite for the oscillator's operation. Furthermore, if the (R1+R2)×C1 discharging time constant is correctly chosen, C1 will have been virtually entirely discharged by the time the next channel-changing pulse is generated, so that a charge-total discharge situation will persist.

Now however, suppose a large number of channels are required to be bypassed, as when going from a low VHF to a high UHF channel. In this situation it can be expected that the rate at which channel-changing pulses are generated will increase. As a result, C1 will not become fully discharged between pulses and the voltage across it will increase as channel-changing pulses are developed. At some point the voltage at the oscillator enabling input will exceed its threshold level and the oscillator will be enabled. The additional pulses generated by the oscillator will be added to the single pulses already occurring at the base of Q2 and, as a result, the synthesizer will be incremented (or decremented, as the case may be) through a greater number of channels in response to a given amount of rotation of the tuning knob.

Although the disclosure of this invention will enable those skilled in the art of circuit design to construct appropriate integrator and oscillator circuits given the specific shaft-encoding scheme utilized, a concrete example may be helpful. When used with a specific shaft-encoding mechanism, it was emperically found that a channel-changing pulses of 5-volt amplitude, 2 millisecond duration and 40 millisecond repetition rate (approximately equal to the inverse of the pulse period) would comprise a reliable indication of a situation under which a large number of channels are sought to be bypassed. The nominal values for R1, R2 and C1 were then approximately 25 Kohm, 510 Kohm and 0.1 microfarad. As a result both the charging and discharging time constants were somewhat longer than the duration and period of the channel-changing pulses, respectively.

Another salient feature of this invention is that the frequency of the oscillator is made to increase as the voltage at the output of the integrator increases, that is, as the repetition rate of the channel-changing pulses increases. This is because the oscillator operating frequency is approximately equal to $1/(3R_x C_4)$, where $R_x$ is the equivalent net resistance presented by R4, R5 and the effective resistance of Q1. Because the effective resistance of Q1 will decrease as the voltage at its gate increases, the oscillator frequency will increase (more stepping pulses generated) as the repetition rate of the channel-changing pulses increases.

It should be noted that although the subject variable pulse rate tuning system has been described with a degree of specificity deemed desirable to assure a complete understanding, it is clear that this invention contemplates variations and modifications obvious to those skilled in the art. For example, variations in the integrator portion of the pulse adding circuit readily suggest themselves. Any one of a number of known circuits sensitive to the rate, or change in rate, of a pulse train can be effectively incorporated. In addition, other types of oscillator circuit could be easily substituted. Finally, although this invention has been described in the context of a television receiver, it should be clear that it has applications in other tpes of equipments characterized by similar channel-changing requirements.

Accordingly, while there has been shown and described what are at present considered the preferred embodiments of the invention, it will be obvious to those skilled in the art that various changes and modifications may be made therein without departing from the scope of the invention as defined by the appended claims.

INDUSTRIAL APPLICABILITY

This invention is useful in communication systems, for example, television receivers, in which channel selection is made from a large number of channels via manual control.

What is claimed is:

1. In a tuning system including a source of channel-changing pulses for operating a channel-selecting device, a variable pulse rate tuning circuit comprising:
   single pulsing means having an input coupled to the channel-changing pulses for developing a single stepping pulse in response to individual channel-changing pulses,
   pulse adding means having an input coupled to the channel changing pulses for selectively developing at least an additional stepping pulse in response to a prescribed channel-changing condition, and
   a stepping pulse combining circuit having an output coupled to the channel-selecting device, an input coupled to the output of the single pulsing means, and an input coupled to the output of the pulse adding means whereby the channel selecting device incrementally changes channels in response to the stepping pulse.

2. A variable pulse rate tuning circuit as described in claim 1 wherein the pulse adding means comprises an oscillator having an output coupled to the stepping pulse combining circuit.

3. A variable pulse rate tuning circuit as described in claim 2 wherein in the oscillator has an enabling input coupled to the source of channel-changing pulses so that the oscillator is enabled during channel-changing conditions under which a substantial number of channels are sought to be bypassed and otherwise disabled.

4. A variable pulse rate tuning circuit as defined in either claim 2 or claim 3 wherein the oscillator comprises a feedback loop including a variable impedance coupled to the channel-changing pulses so that the oscillator frequency varies during channel-changing conditions under which a substantial number of channels are sought to be bypassed.

5. A variable pulse rate tuning circuit as defined in claim 1 wherein the pulse adding means comprises:
   an integrator having an input coupled to the source of channel-changing pulses and
   an oscillator coupled to an output of the integrator, said oscillator having an output coupled to the input of the stepping pulse combining circuit.

6. A variable pulse rate tuning circuit as defined in claim 5 wherein the oscillator has an enabling input coupled to an output of the integrator so that the oscillator is enabled during channel changing conditions under which a substantial number of channels are sought to be bypassed and otherwise disabled.

7. A variable pulse rate tuning circuit as defined in claim 5 wherein the oscillator comprises a feedback loop including a variable impedance coupled to an output of the integrator so that the oscillator frequency varies in response thereto.

8. A variable pulse rate tuning circuit as defined in claim 7 wherein the integrator comprises:
   a diode coupled at one end to the source of channel-changing pulses,
   a first resistance coupled between the other end of the diode and a reference potential,
   a second resistance coupled at one end to the junction of the diode and first resistance,
   a capacitance coupled between the other end of the second resistance and the reference potential.

9. A variable pulse rate tuning circuit as defined in claim 8 wherein the junction of the second resistance and capacitance is coupled to the enabling input of the oscillator.

10. A variable pulse rate tuning circuit as defined in claim 8 wherein the junction of the second resistance and capacitance is coupled to a variable impedance.

11. A variable pulse rate tuning circuit as defined in claim 10 wherein the second resistance is a variable resistance.

12. A variable pulse rate tuning circuit as defined in claim 11 wherein the variable impedance is an FET.

13. In a tuning system including a channel-selecting device coupled and responsive to a source of channel-changing pulses, the improvement comprising variable pulse rate tuning means for increasing the rate at which channels are incremented or decremented during conditions under which a substantial number of channels are sought to be bypassed, said means comprising:
   an oscillator having an enabling input and an output coupled to the channel-selecting device;
   integrating means having an input coupled to the source of channel-changing pulses and an output coupled to the enabling input of the oscillator, said integrating means for integrating the channel-changing pulses so that the oscillator is enabled during conditions under which a substantial number of channels are sought to be bypassed.

14. An improvement as defined in claim 13 wherein the oscillator includes a feedback loop having a variable impedance coupled to the source of channel changing pulses and responsive thereto so that the oscillator frequency varies during conditions under which a substantial number of channels are sought to be bypassed.

15. An improvement as defined in claim 14 wherein the variable impedance is an FET.

* * * * *